United States Patent [19]

Thorsrud

[11] Patent Number: 4,840,758
[45] Date of Patent: Jun. 20, 1989

[54] METHODS OF PREPARING MOLDED THERMOPLASTIC ARTICLES WHEREIN RADIO FREQUENCY ENERGY IS UTILIZED TO HEAT THE THERMOPLASTIC MATERIAL

[75] Inventor: Agmund K. Thorsrud, Bartlesville, Okla.

[73] Assignee: Phillips Petroleum Company, Bartlesville, Okla.

[21] Appl. No.: 242,550

[22] Filed: Sep. 9, 1988

[51] Int. Cl.$^4$ .................. B29C 35/12; B29C 43/00; B29C 67/22

[52] U.S. Cl. .................... 264/26; 264/45.3; 264/54; 264/257; 264/320; 264/325; 264/DIG. 5; 521/95

[58] Field of Search ............... 264/26, 45.3, 257, 54, 264/DIG. 5, 325, 319, 320; 521/95

[56] References Cited

U.S. PATENT DOCUMENTS

| | | | |
|---|---|---|---|
| Re. 30,984 | 6/1982 | Hipchen et al. | 428/297 |
| 2,998,501 | 8/1961 | Edburg et al. | 264/26 X |
| 3,010,157 | 11/1961 | Cizek | 264/26 |
| 3,216,849 | 11/1965 | Jacobs . | |
| 3,242,238 | 3/1966 | Edburg et al. | 264/26 |
| 3,243,485 | 3/1966 | Griffin | 264/51 |
| 3,257,483 | 6/1966 | Eberle | 264/45.3 |
| 3,354,023 | 11/1967 | Dunnington et al. . | |
| 3,379,799 | 4/1968 | Goldman | 264/26 |
| 3,399,098 | 8/1968 | Omoto et al. | 156/200 |
| 3,591,882 | 7/1971 | Pearsall | 12/146 |
| 3,592,785 | 7/1971 | Patterson et al. . | |
| 3,640,913 | 2/1972 | Cerra | 521/95 X |
| 3,743,601 | 7/1973 | Rao | 252/62 |
| 3,756,839 | 9/1973 | Rao | 106/75 |
| 3,792,141 | 2/1974 | Offutt | 264/47 |
| 4,164,512 | 8/1979 | Brenner et al. | 521/95 X |
| 4,181,780 | 1/1980 | Brenner et al. | 521/95 X |
| 4,188,355 | 2/1980 | Graham et al. | 264/26 |
| 4,259,384 | 3/1981 | Veiga et al. | 428/97 |
| 4,288,399 | 9/1981 | Siedenstrang et al. | 264/25 |
| 4,306,034 | 12/1981 | Thorsrud | 521/95 |
| 4,360,607 | 11/1982 | Thorsrud et al. | 523/137 |
| 4,456,706 | 6/1984 | Siedenstrang et al. | 521/95 X |
| 4,522,875 | 6/1985 | Still, Jr. et al. | 428/285 |
| 4,575,430 | 3/1986 | Periard et al. | 252/12.6 |
| 4,740,530 | 4/1988 | Pip | 521/95 X |
| 4,790,965 | 12/1988 | Thorsrud | 264/26 X |

OTHER PUBLICATIONS

Monsanto Industrial Chemicals Co. Technical Bulletin IC/PL-339, "SANTICIZER® 8 N-ethyl-o- and p-toluenesulfonamide".

Primary Examiner—Philip Anderson
Attorney, Agent, or Firm—Laney, Dougherty, Hessin & Beavers

[57] ABSTRACT

Improved methods of preparing molded thermoplastic articles are provided. The methods are basically comprised of the steps of admixing a radio frequency energy sensitizing agent comprised of N-ethyl toluenesulfonamide with a thermoplastic polymer, applying radio frequency energy to the mixture formed for a time sufficient to produce a moldable consistency in the mixture, and then compression molding the mixture to produce a molded article therefrom.

25 Claims, No Drawings

METHODS OF PREPARING MOLDED THERMOPLASTIC ARTICLES WHEREIN RADIO FREQUENCY ENERGY IS UTILIZED TO HEAT THE THERMOPLASTIC MATERIAL

BACKGROUND OF THE INVENTION

1. Field of the Invention

This invention relates to methods of preparing molded thermoplastic articles, and more particularly, but not by way of limitation, to methods of preparing molded thermoplastic articles wherein radio frequency energy is utilized.

2. Description of the Prior Art

Methods of preparing molded articles from thermoplastic materials using radio frequency energy to heat the materials are well known. For example, U.S. Pat. No. 4,288,399 issued Sept. 8, 1981 discloses a method of preparing molded articles wherein an amine polarizing agent is utilized to sensitize a thermoplastic composition to microwave energy followed by the application of such microwave energy to the composition for a time sufficient to produce a moldable consistency therein. The polarizing or radio frequency energy sensitizing agent, when mixed with a thermoplastic composition, functions to render the resulting mixture susceptible, or at least more susceptible, to the heating effects of radio frequency energy.

Heretofore, it has generally been necessary to ball mill or otherwise intimately mix the radio frequency energy sensitizing agent used with the thermoplastic material for a prolonged period of time prior to subjecting the resulting mixture to radio frequency energy. Also, it has generally been necessary to utilize separate sensitizing, plasticizing and lubricating agents in thermoplastic compositions. Plasticizing agents improve the low temperature flexibility and other properties of the molded product, and lubricating agents improve extrusion and molding properties.

Foamed thermoplastic products have heretofore been produced by mixing a chemical blowing agent with the thermoplastic composition at a temperature below the decomposition temperature of the blowing agent, and subsequently heating the mixture by conductance, convection or mechanical work to a temperature high enough for the blowing agent to decompose and release gases. Because the thermoplastic composition with blowing agent is often heated prior to being placed in a mold, the process involves the risk that the blowing agent will prematurely decompose. When reinforcing fibers, filaments or mats formed from fibers or filaments (all referred to herein as fibrous materials) are incorporated in the thermoplastic material to improve the strength and other physical properties of the resulting foamed product, the often used initial heating of the thermoplastic composition to facilitate combining the blowing agent and fibrous materials therewith risks premature foaming and often results in non-uniform cellular structure or the collapse of the cellular structure due to wicking action by the fibrous materials.

By the present invention improved methods of preparing molded thermoplastic articles, both solid and foamed and with and without fibrous materials, are provided which obviate the above problems.

SUMMARY OF THE INVENTION

The present invention is directed to methods of preparing molded thermoplastic articles which basically comprise the steps of admixing a radio frequency energy sensitizing agent comprised of N-ethyl toluenesulfonamide with a thermoplastic polymer, applying radio frequency energy to the mixture for a time sufficient to produce a moldable consistency in the mixture, and then compression molding the mixture to produce a molded article therefrom. The radio frequency energy can be applied to the mixture after it is introduced into a mold, or the energy can be applied just prior to transferring the mixture into a mold.

The methods are particularly suitable for use with polyolefin and polyarylene sulfides, and the N-ethyl toluenesulfonamide sensitizing agent also functions to plasticize and provide lubrication to the thermoplastic material. While intimate mixing such as by ball milling for a period of time can be utilized for increasing the plasticizing and lubricating functions of the N-ethyl toluenesulfonamide, thermoplastic polymers such as polyolefins and polyarylene sulfides only require mixing to the extent necessary to bring about the surface wetting of the polymer particles by the liquid sensitizing agent at room temperature in order to adequately sensitize the polymer particles to radio frequency energy.

In one aspect, the present invention is directed to methods of preparing molded thermoplastic articles including composites or laminates reinforced with fibrous materials.

In another aspect of the present invention, methods are provided for preparing molded articles formed of foamed thermoplastic with or without reinforcing fibrous materials. The reinforced composites produced from foamed thermoplastic can be porous or non-porous.

It is, therefore, a general object of the present invention to provide methods of preparing molded thermoplastic articles.

A further object of the present invention is the provision of methods of preparing molded thermoplastic articles utilizing radio frequency energy for heating wherein a single component requiring minimum mixing time at low temperature is utilized as the radio frequency energy sensitizing agent.

Still a further object of the present invention is the provision of methods for preparing molded thermoplastic articles, both solid and foamed and with and without fibrous reinforcing materials, wherein the thermoplastic polymer used is efficiently sensitized to radio frequency energy by combining a single component therewith.

Other aspects, objects and advantages of the present invention will be readily apparent to those skilled in the art upon a reading of the description of preferred embodiments which follows.

DESCRIPTION OF PREFERRED EMBODIMENTS

In accordance with the present invention, methods are provided for preparing molded thermoplastic articles from thermoplastic polymers. The polymers are made radio frequency energy sensitive by admixing a sensitizing agent comprised of N-ethyl toluenesulfonamide therewith. Radio frequency energy is then applied to the composition for a time sufficient to produce a moldable consistency in the composition, and the composition is compression molded to produce a molded article therefrom.

In a further embodiment of the invention, improved methods of preparing molded reinforced thermoplastic articles are provided. That is, in addition to the above-described radio frequency energy sensitizing agent, a fibrous material is combined with the thermoplastic polymer composition prior to molding. The term "fibrous material" is used herein to mean fibers and filaments such as glass fibers, polyaramid fibers and carbon filaments as well as one or more fibrous or filamentous mats which are surrounded by a matrix of the thermoplastic composition.

In preparing molded reinforced thermoplastic articles in accordance with this invention, the fibrous material utilized is preferably combined with the mixture of thermoplastic polymer and radio frequency energy sensitizing agent at low temperature. When one or more fibrous material mats are utilized, the mats are surrounded with a matrix of the thermoplastic polymer and sensitizing agent mixture in a known manner, preferably while in the solid unmelted state. The thermoplastic mixture surrounded or impregnated mats are then compressed and irradiated with radio frequency energy. The resulting mixture of thermoplastic polymer, sensitizing agent and fibrous material is subjected to radio frequency energy to produce a moldable consistency therein and compression molded. As indicated above, the mixture can be introduced into a mold and the radio frequency energy applied thereto, or the radio frequency energy can be applied to the mixture just prior to introduction into a mold in a transfer molding process.

In yet another embodiment of the invention, a blowing agent is combined with the mixture of thermoplastic polymer and radio frequency energy sensitizing agent, either with or without fibrous material, whereby a foamed porous or nonporous thermoplastic reinforced or non-reinforced article results. The blowing agent decomposes to produce gases which foam the thermoplastic polymer composition only after the radio frequency energy is applied to the composition. That is, the radio frequency energy is applied to the composition for a period of time such that the composition is heated to a temperature above the decomposition temperature of the blowing agent. The gases formed by the decomposition cause the thermoplastic polymer composition to be foamed just prior to or as the composition is compression molded.

While various thermoplastic polymers which are well known to those skilled in the art can be utilized in accordance with the present invention, preferred polymers are selected from the group consisting of polyolefins and polyarylene sulfides. Of the various polyolefins, polyethylene is preferred. The term "polyarylene sulfide" includes homopolymers and the normally solid arylene sulfide copolymers, terpolymers and the like. Examples of polyarylene sulfides, often abbreviated PAS, are polybiphenylene sulfide, polytoluenesulfide and a copolymer prepared from dichlorobenzene, dichlorotoluene and sodium sulfide. Of these, polyphenylene sulfide is preferred.

The radio frequency energy sensitizing agent of this invention is comprised of N-ethyl toluenesulfonamide. A liquid mixture of the ortho- and para- isomers is particularly preferred. Such a mixture is commercially available from Monsanto Industrial Chemicals Company of St. Louis, Mo. under the trademark SANTICIZER®8. The liquid mixture of N-ethyl-ortho- and para-toluenesulfonamide is highly polar, has a very high boiling point, has a low viscosity, is non-hygroscopic, is non-toxic, and provides superior radio frequency sensitizing to thermoplastic polymers when mixed therewith in relatively small quantities. When used solely as a sensitizing agent, the liquid mixture is preferably mixed at room temperature with the thermoplastic polymer powder for a sufficient time to surface wet the polymer. The sensitizing agent is mixed with the polymer in an amount to provide the required sensitivity to radio frequency energy, generally in an amount in the range of from about 1% to about 10% by weight of the polymer utilized. When used as a radio frequency energy sensitizer and also as a plasticizer and/or lubricant, the mixture of N-ethyl-ortho- and para-toluenesulfonamide is preferably combined with the polymer in an amount in the range of from about 2% to about 15% by weight of the polymer and ball milled therewith. When the polymer used is polyethylene, the sensitizing agent is preferably admixed therewith in an amount of about 4%-6% by weight of the polymer. When the polymer is polyphenylene sulfide, the sensitizing agent is preferably admixed therewith in an amount of about 2%-10% by weight of the polymer.

In producing foamed thermoplastic articles, various well known blowing agents can be utilized such as the reaction product of carboxylic acid and urea absorbed on silica and phenyl tetrazole. Of the foregoing, a phenyl tetrazole blowing agent is preferred. A suitable such phenyl tetrazole blowing agent is commercially available from Olin Chemicals Company of Stamford, Conn. under the trade name EXPANDEX®5PT.

The particular amount of blowing agent utilized in the thermoplastic polymer composition to foam the composition varies depending upon the particular blowing agent used, the desired density of the foam produced thereby, etc. Generally, phenyl tetrazole is combined with the mixture of thermoplastic polymer and radio frequency energy sensitizing agent mixture in an amount of about 0.5% to about 2.5% by weight of the polymer used. In order to insure that the blowing agent is uniformly distributed throughout the mixture, the mixture including blowing agent is preferably ball milled for a period of time prior to applying the radio frequency energy thereto.

The reinforcing fibrous material which can be utilized in accordance with the present invention can be continuous filaments or the filaments can be cut or chopped (staple fibers). Chopped glass fibers are particularly preferred for reinforcing the foamed articles produced in accordance with this invention. When reinforcing mats are utilized, they can be formed of continuous filaments or staple fibers and can be bonded by means of a binder, by heating, by needle punching, etc. In addition to glass, the fibrous materials can be formed of carbon, aromatic polyamides or other fiber-forming inorganic materials and mixtures.

In order to further illustrate the methods of the present invention, the following examples are given.

EXAMPLE 1

A non-crosslinked polyphenylene sulfide polymer produced by Phillips Petroleum Company under the trade designation "PR-09" is used to test a mixture of N-ethyl-ortho- and para-toluenesulfonamide as a radio frequency energy sensitizer. The N-ethyl-ortho- and para-toluenesulfonamide used is Monsanto's SANTICIZER®8 having the specifications and typical properties given in Table I below.

TABLE I

| Properties of N—Ethyl-o- and p-Toluenesulfonamide[1] | |
|---|---|
| Appearance | Light-yellow, viscous liquid |
| Color (molten, APHA) | 200 maximum |
| Odor | Slight, characteristic |
| Free amide, % | 3–13 |
| Acidity, meq./100 g | 0.80 maximum |
| Chlorine, % | 0.01 maximum |
| Structural formula | $CH_3.C_6H_4.SO_2NH.C_2H_5$ |
| Molecular weight | 199.22 |
| Specific gravity, 25°/25° C. | 1.190 |
| Density, at 25° C., pounds per gallon | 9.92 |
| Refractive index, at 25° C. | 1.540 |
| Solidification temperature, °C. | 0 |
| Crystallizing point, °C. | <40 |
| Boiling point (760 mmHg), °C. | 340 |
| Vapor pressure, mmHg | |
| 150° C. | 0.45 |
| 200° C. | 5.5 |
| Surface tension, at 25° C., dynes/cm | 44.5 |

[1]Monsanto Industrial Chemicals Co. Specifications and Typical Properties (Technical Bulletin IC/PL-339)

The polyphenylene sulfide polymer (35 mesh, U.S. Sieve Series) is ball milled for one-half to one hour at room temperature with 0, 1, 2, 5, 10, 20 and 40 parts N-ethyl-o- and p-toluenesulfonamide sensitizing agent per 100 parts of polymer. At 20 parts sensitizing agent per 100 parts polymer the mixture is still free flowing. With 40 parts sensitizing agent per 100 parts polymer, the mixture has a dry consistency, but in order to restore free flowing properties 10 parts per hour of a radio frequency energy unresponsive silica are added to that mixture.

The various mixtures are each placed in a TEFLON® sample holder, heated in an Ultramic Industries 9 KW, 100 MHz DIATRON® 97001 radio frequency generator, and subsequently transfer molded in a GIVEN-PHI® press with the mold maintained at a temperature of 230° F. Each of the mixtures are heated in the radio frequency generator for the time required for the polymer to be melted and achieve good flow characteristics. Such times and the characteristics of the thermoplastic parts produced are given in Table II below.

TABLE II

Polyphenylene Sulfide-
N—Ethyl-o- and p-Toluenesulfonamide
Mixture Heating Times and Molded Part Properties

| Quantity of N—Ethyl-o and pToluenesulfonamide, phr | Heating Time, Seconds | Part Properties |
|---|---|---|
| 0 | 240 | Shiny brittle break; brown color |
| 1 | 180 | Shiny brittle break; brown color |
| 2 | 120 | Shiny brittle break; brown color |
| 5 | 40 | Dull break; tan color |
| 10 | 30 | Dull break; dark grey color |
| 20 | 20 | Dull break; grey color |
| 40 | 5 | Dull break; ivory color |

As can be seen from Table II, the amount of N-ethyl-o- and p-toluenesulfonamide in admixture with polyphenylene sulfide polymers has a dramatic effect on the radio frequency energy heating time, the brittleness of the molded parts and the color of the molded parts.

EXAMPLE 2

Various test mixtures of the polyphenylene sulfide and N-ethyl-o- and p-toluenesulfonamide described in Example 1 are dry blended in a high speed mixer at 900 rpm. The mixtures are thereafter extruded at 600° F. (nozzle temperature) in a Davis Standard Thermatic III extruder, and subsequently chopped and injection molded in a four-zone injection molding machine. The injection molding machine temperatures are 550° F. in zone 1, 550° F. in zone 2, 530° F. in zone 3 and 400° F. in zone 4. The molded parts produced are annealed 2 hours at 400° F., and then tested for the physical properties listed in Table III below. The procedures followed in the physical properties tests are ASTM standard, as noted in Table III. The results of the physical property tests are given in Table III.

TABLE III

Properties of Molded Non-Reinforced Mixtures of Polyphenylene Sulfide and N—Ethyl-o- and p-Toluenesulfonamide

|  | Mixture 1 | Mixture 2 | Mixture 3 | Mixture 4 | Mixture 5 |
|---|---|---|---|---|---|
| Quantity of PPS Polymer, parts by weight | 100 | 100 | 100 | 100 | 100 |
| Quantity of N—ethyl-o- and p-toluenesulfonamide, parts by weight | 0 | 1 | 2.5 | 5 | 10 |
| Flexural Modulus, MPa (ASTM D790) | 3,543 | 3,751 | 3,754 | 3,685 | 3,225 |
| Flexural Strength, MPa (ASTM D790) | 129 | 138 | 137 | 131 | 127 |
| Tensile Yield, MPa (ASTM D638) | 82.9 | 75.0 | 83.5 | 93.0 | 66.6 |
| Izod Impact | | | | | |
| Notched, Joule/m | 34.6 | 35.1 | 35.1 | 37.1 | 34.9 |
| Unnotched, Joule/m (ASTM D256) | 294 | 222 | 188 | 202 | 204 |
| Heat Distortion, °C. at 1820 KPa (ASTM D1637) | 119 | 112 | 106 | 98 | 92 |
| Exudation | None | None | None | None | Very slight |

EXAMPLE 3

Various test mixtures of the polyphenylene sulfide and N-ethyl-O- and p-toluenesulfonamide described in Example 1 above are prepared by dry blending in a high speed mixer at 900 rpm. 1½ ounce glass fiber mats are impregnated with each mixture. The resulting composites are compression molded in a 9"×10" positive pressure mold at a temperature of 600° F., and then annealed for 2 hours at 400° F. The molded parts are tested for physical properties using standard test procedures. The results of the tests are set forth in Table IV below.

TABLE IV

Properties of Molded Reinforced Mixtures of Polyphenylene Sulfide and N—Ethyl-o- and p-Toluenesulfonamide

|  | Mixture 1 | Mixture 2 | Mixture 3 | Mixture 4 |
|---|---|---|---|---|
| Quantity of PPS Polymer, parts by weight | 100 | 100 | 100 | 100 |
| Quantity of N—ethyl-o- and p-toluenesulfonamide, parts by weight | 0 | 2.5 | 5.0 | 7.5 |
| Weight of PPS, g | 187 | 155 | 151 | 149 |
| Weight of Glass Fiber Mat, g | 130 | 130 | 121 | 110 |
| Flexural Modulus, MPa (ASTM D790) | 9,648 | 10,713 | 9,271 | 9,143 |
| Flexural Strength, MPa (ASTM D790) | 285 | 299 | 229 | 217 |
| Tensile Break, MPa (ASTM D638) | 192 | 213 | 169 | 148 |
| Elongation, % (ASTM D638) | 4.88 | 5.19 | 4.21 | 4.15 |
| Heat Distortion, °C. at 1820 KPa (ASTM D1637) | 279 | 277 | 277 | 272 |
| Exudation | None | None | None | None |
| Surface Appearance | Rough | Slightly Rough | Smooth | Very Smooth |

From Tables III and IV above it can be seen that both non-reinforced and glass fiber reinforced molded polyphenylene sulfide parts containing N-ethyl-o- and p-toluenesulfonamide have excellent physical properties, particularly at a N-ethyl-o- and p-toluenesulfonamide concentration of 2.5% by weight of the polymer used.

EXAMPLE 4

Ultrahigh molecular weight polyethylene polymer manufactured by Hercules, Inc. of Wilmington, Del. (now Himont Corp., Wilmington, Del.) under the trade designation UHMWPE 1900 having an intrinsic viscosity of 27 is used to prepare test mixtures containing a radio frequency energy sensitizing agent and various lubricants. 100 parts by weight portions of the polyethylene polymer are dry blended with 4 parts by weight sodium aluminum silica sensitizing agent manufactured by the J. M. Huber Corp., of Havre DeGrace, Md., after having first been wetted with 1 part by weight of the various lubricants set forth in Table V below. The resulting mixtures are each heated in a 9 KW, 100 MHz radio frequency generator [Ultramic Industries, Inc. of Albany, N.Y. (now NTRONIX of Nashville, Tennessee) Model 9700L] in a TEFLON ® sample holder, and transfer molded into a ⅛ inch spiral flow mold, under the following conditions:

| air gap on RF-generator between electrodes: | 2¼ inches |
|---|---|
| infrared temperature controller setting: | 340° F. |
| amount of each sample: | 16 grams |
| mold temperature: | 220° F. |
| ram pressure (1-inch ram): | 2900 psi |

The flow length of each molded sample produced is determined and the molded samples are observed for color change. The results of these tests are given in Table V.

TABLE V

Flow Lengths of Flow Molded Samples Using Various Lubricants

| Lubricant Used | Flow Length, in. | Observations |
|---|---|---|
| None | 1.25 | No color change |
| Silicone Fluid (Dow-Corning SF1080) | 2.0 | Slight grey color |
| Glycerin | 5.0 | Tan color |
| Triethanolamine | less than 1 | Yellow color |
| Diethylene glycol | 5.75 | Slight yellow color |
| N—ethyl-o- and p-toluenesulfonamide | 9.5 | No color change. (More uniform melt) |

A direct comparison of the mixtures containing N-ethyl-o- and p-toluenesulfonamide and the Dow-Corning silicone fluid lubricants with unmodified polyethylene polymer is made by preheating for 30 minutes at 350° F., then compression molding at 4000 psi followed by 10 minutes of cooling. The molded samples produced are tested for physical properties using standard procedures as indicated in Table VI below.

TABLE VI

Physical Properties of Molded Samples Using Different Lubricants

|  | N—Ethyl-o and p-toluenesulfonamide[1] | Silicone[2] Fluid | No Lubricant |
|---|---|---|---|
| Yield, psi (ASTM D638) | 2870 | 2787 | 2843 |
| Tensile, psi (ASTM D638) | 4440 | 3820 | 5520 |
| Elongation, % (ASTM D638) | 170 | 125 | 270 |
| High Speed Impact: |  |  |  |
| Impact Rate, in/sec | 188 | 177 | 178 |
| Max. Load, lbs. | 313 | 289 | 482 |
| Apparent Modulus, lbs/in | 1610 | 932 | 1380 |
| Energy Peak, in. lbs. | 35.6 | 32.4 | 82.4 |
| Energy Break, in. lbs. | 37.6 | 32.4 | 82.4 |

[1]Monsanto SANTICIZER ®8
[2]Dow-Corning SF1080

From Tables V and VI, it can be seen that N-ethyl-o- and p-toluenesulfonamide functions as a very efficient lubricant in mold flow, and has less influence on the physical properties of the molded products than silicone fluid. Further, the N-ethyl-o- and p-toluenesulfonamide has a beneficial effect on radio frequency energy response, is non-toxic, has a very high boiling point (340° C.), is relatively low in viscosity and is non-hygroscopic making it ideal for use as a radio frequency energy sensitizer and lubricant.

EXAMPLE 5

40 grams of the polyphenylene sulfide polymer described in Example 1 are ball milled with 4 grams of the N-ethyl-o- and p-toluenesulfonamide described in Example 1 for a few minutes to uniformly wet the surface of the polymer with the sensitizing agent. 0.6 grams of a blowing agent, i.e., a phenyl tetrasole blowing agent manufactured by Olin Chemicals Company of Stamford, Conn. under the trade name EXPANDEX®5PT, is combined with the mixture and the mixture is ball milled for several additional minutes. The resulting free flowing powder is poured into a preheated (200° C.) cylindrical TEFLON® mold (outer diameter 5½ inches, cavity diameter 4¼ inches). A preheated loose-fitting TEFLON® disc is placed on top of the powder. The mold is placed in an Ultramic Industries DIATRON®9700L 100 MHz, 9 KW radio frequency energy generator with electrode plate distance of 3½ inches. After 3 minutes exposure time in the radio frequency energy field, the lid is removed and the foam produced in the mold is allowed to cool. The foamed product has a medium fine cellular structure and the density is 0.35 grams per cubic centimeter.

40 grams of the same polyphenylene sulfide polymer are ball milled with 2 grams of the N-ethyl-o- and p-toluenesulfonamide along with 2 grams of sodium aluminum silicate sensitizing agent manufactured by the J. M. Huber Corp. of Havre DeGrace, Md. 0.6 grams of a blowing agent manufactured by the Struktol Company of America under the trade name STRUKTOL® FA-541 (a reaction product of carboxylic acid and urea absorbed onto a silica filler) are added to the mixture, and the ball milling is continued for a total of 2 hours. The free flowing powder produced is poured into a preheated TEFLON® mold as described above, and covered with the same preheated, loose fitting TEFLON® disc as described above. The mold and powder are irradiated for 5 minutes in the same radio frequency energy generator described. The lid is removed from the mold and the foam allowed to cool. The resulting grey foam had a fine pore structure and a density of 0.58 grams per cubic centimeter.

From the above it can be seen that the N-ethyl-o- and p-toluenesulfonamide functions efficiently as a radio frequency energy sensitizer in the presence of blowing agents.

What is claimed is:

1. A method of preparing a molded thermoplastic article comprising the steps of:
   (a) admixing a radio frequency energy sensitizing agent comprised of N-ethyl toluenesulfonamide with a thermoplastic polymer;
   (b) applying radio frequency energy to the mixture formed in step (a) for a time sufficient to produce a moldable consistency in said mixture; and
   (c) compression molding said mixture to produce a molded article therefrom.

2. The method of claim 1 wherein said radio frequency energy sensitizing agent is comprised of a mixture of N-ethyl-ortho- and para-toluenesulfonamide.

3. The method of claim 2 wherein said thermoplastic polymer is selected from the group consisting of polyolefins and polyarylene sulfides.

4. The method of claim 3 wherein said radio frequency sensitizing agent is admixed with said polymer in an amount in the range of from about 1% to about 10% by weight of said polymer.

5. The method of claim 2 wherein said polymer is polyethylene and said sensitizing agent is admixed therewith in an amount of about 4% by weight of the polymer.

6. The method of claim 2 wherein said polymer is polyphenylene sulfide and said sensitizing agent is admixed therewith in an amount of about 2.5% by weight of said polymer.

7. The method of claim 4 which is further characterized to include the step of combining a fibrous material with the mixture of step (a).

8. The method of claim 1 which is further characterized to include the steps of:
   combining a blowing agent with the mixture of step (a); and
   applying said radio frequency energy in step (b) for a time sufficient to cause said blowing agent to gasify and foam said mixture.

9. The method of claim 8 wherein said radio frequency energy sensitizing agent is comprised of a mixture of N-ethyl-ortho- and para-toluenesulfonamide.

10. The method of claim 9 wherein said polymer is selected from the group consisting of polyolefins and polyarylene sulfides.

11. The method of claim 10 wherein said radio frequency sensitizing agent is admixed with said polymer in an amount in the range of from about 4% to about 10% by weight of said polymer.

12. The method of claim 11 wherein said blowing agent is phenyl tetrazole and is combined with said mixture in an amount in the range of from about 0.5% to about 2.5% by weight of said polymer.

13. The method of claim 12 which is further characterized to include the step of combining a fibrous material with the mixture of step (a).

14. The method of claim 13 wherein said fibrous material is in the form of one or more mats and said one or more mats are surrounded with a matrix of the mixture of step (a).

15. In a method of preparing a molded thermoplastic article wherein a molding composition comprising a thermoplastic polymer is introduced into a mold, radio frequency energy is applied to the composition for a time sufficient to produce a moldable consistency in the composition and then the composition is compression molded to produce a molded article, the improvement which comprises admixing a radio frequency energy sensitizing agent comprised of N-ethyl toluenesulfonamide with said composition whereby said polymer is wetted with said sensitizing agent prior to introducing said composition into said mold.

16. The method of claim 15 wherein said radio frequency energy sensitizing agent is comprised of a mixture of N-ethyl-ortho- and para-toluenesulfonamide.

17. The method of claim 16 wherein said thermoplastic polymer is selected from the group consisting of polyolefins and polyarylene sulfides.

18. The method of claim 17 wherein said radio frequency sensitizing agent is admixed with said polymer in an amount in the range of from about 2% to about 10% by weight of said polymer.

19. The method of claim 16 wherein said polymer is polyethylene sulfide and said sensitizing agent is admixed therewith in an amount of about 4% by weight of said polymer.

20. The method of claim 16 wherein said polymer is polyphenylene sulfide and said sensitizing agent is admixed therewith in an amount of about 5% by weight of said polymer.

21. A method of preparing a molded reinforced thermoplastic article containing fibrous material comprising the steps of:

(a) admixing a radio frequency energy sensitizing agent comprised of N-ethyl toluenesulfonamide with a thermoplastic polymer;

(b) combining a fibrous material with the mixture formed in step (a);

(c) introducing the fibrous material containing mixture formed in step (b) into a mold;

(d) applying radio frequency energy to the mixture introduced into said mold in accordance with step (c) for a time sufficient to produce a moldable consistency in said mixture; and (e) compression molding said mixture.

22. The method of claim 21 wherein said radio frequency energy sensitizing agent is comprised of a mixture of N-ethyl-ortho- and para-toluenesulfonamide.

23. The method of claim 22 wherein said thermoplastic polymer is selected from the group consisting of polyolefins and polyarylene sulfides.

24. The method of claim 23 which is further characterized to include the steps of:

combining a blowing agent with the mixture of step (a); and applying said radio frequency energy in step (d) for a time sufficient to cause said blowing agent to gasify and foam said mixture.

25. The method of claim 24 wherein said blowing agent is phenyl tetrazole and is combined with said mixture in an amount in the range of from about 0.5% to about 2.5% by weight of the polymer used.

* * * * *